(12) United States Patent
Sugie

(10) Patent No.: US 12,537,520 B2
(45) Date of Patent: Jan. 27, 2026

(54) GATE DRIVER CIRCUIT

(71) Applicant: ROHM CO., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 180 days.

(21) Appl. No.: 18/440,139

(22) Filed: Feb. 13, 2024

(65) Prior Publication Data

US 2024/0283445 A1   Aug. 22, 2024

(30) Foreign Application Priority Data

Feb. 20, 2023 (JP) ................. 2023-024662

(51) Int. Cl.
*H03K 17/284* (2006.01)
*H02P 27/00* (2006.01)

(52) U.S. Cl.
CPC ........... *H03K 17/284* (2013.01); *H02P 27/00* (2013.01); *H03K 2217/0063* (2013.01); *H03K 2217/0072* (2013.01)

(58) Field of Classification Search
CPC ......... H03K 17/284; H03K 2217/0063; H03K 2217/0072; H02P 27/00
See application file for complete search history.

(56) References Cited

U.S. PATENT DOCUMENTS

| | | | |
|---|---|---|---|
| 2011/0254481 A1* | 10/2011 | Chen ..................... | H02P 6/28 318/400.13 |
| 2014/0139160 A1* | 5/2014 | Hattori ................. | H03K 17/162 318/400.27 |
| 2024/0204776 A1* | 6/2024 | Mitsuhira .......... | H03K 17/6871 |

* cited by examiner

Primary Examiner — Zoheb S Imtiaz
(74) Attorney, Agent, or Firm — CANTOR COLBURN LLP

(57) ABSTRACT

The present disclosure provides a gate driver circuit. An external resistor is connected to a setting pin. A high-side dead time circuit is configured to receive a first high-side control signal and generate a second high-side control signal. An analog delay circuit is configured to delay the first high-side control signal by a delay time corresponding to a resistance value of the external resistor to generate a delayed high-side control signal. A selector is configured to receive the first high-side control signal and the delayed high-side control signal, select one according to an electrical state of the setting pin, and output the selected signal as the second high-side control signal.

11 Claims, 6 Drawing Sheets

GATE DRIVER CIRCUIT

CROSS REFERENCE TO RELATED APPLICATIONS

The present invention claims priority under 35 U.S.C. § 119 to Japanese Application, 2023-024662, filed on Feb. 20, 2023, the entire contents of which being incorporated herein by reference.

TECHNICAL FIELD

The present disclosure relates to a gate driver circuit.

BACKGROUND

A switching circuit such as a single-phase bridge circuit, an H-bridge circuit or a 3-phase bridge circuit has lead wires including a high-side arm and a low-side arm. The high-side arm and the low-side arm have a power transistor and a flywheel diode connected in parallel.

Each lead wire is capable of switching between a high output state in which a high-side transistor is turned on and a low-side transistor is turned off, and a low output state in which a high-side transistor is turned off and a low-side transistor is turned on. During a transition from the high output state to the low output stage or from the low output state to the high output state, if the high-side transistor and the low-side transistor are turned on simultaneously, a through current flows. To prevent the through current, a high impedance state for turning off both of the high-side transistor and the low-side transistor is inserted for the transition from the high output state to the low output stage or from the low output state to the high output state. The high impedance state is referred to as a dead time.

A gate driver circuit driving the switching circuit is installed with a function of automatically inserting the dead time. Moreover, the gate driver circuit includes a setting pin for setting a length of the dead time for a user to be able to externally set the length of the dead time.

DETAILED DESCRIPTION OF THE EMBODIMENTS

Summary of Embodiments

Figure 1:
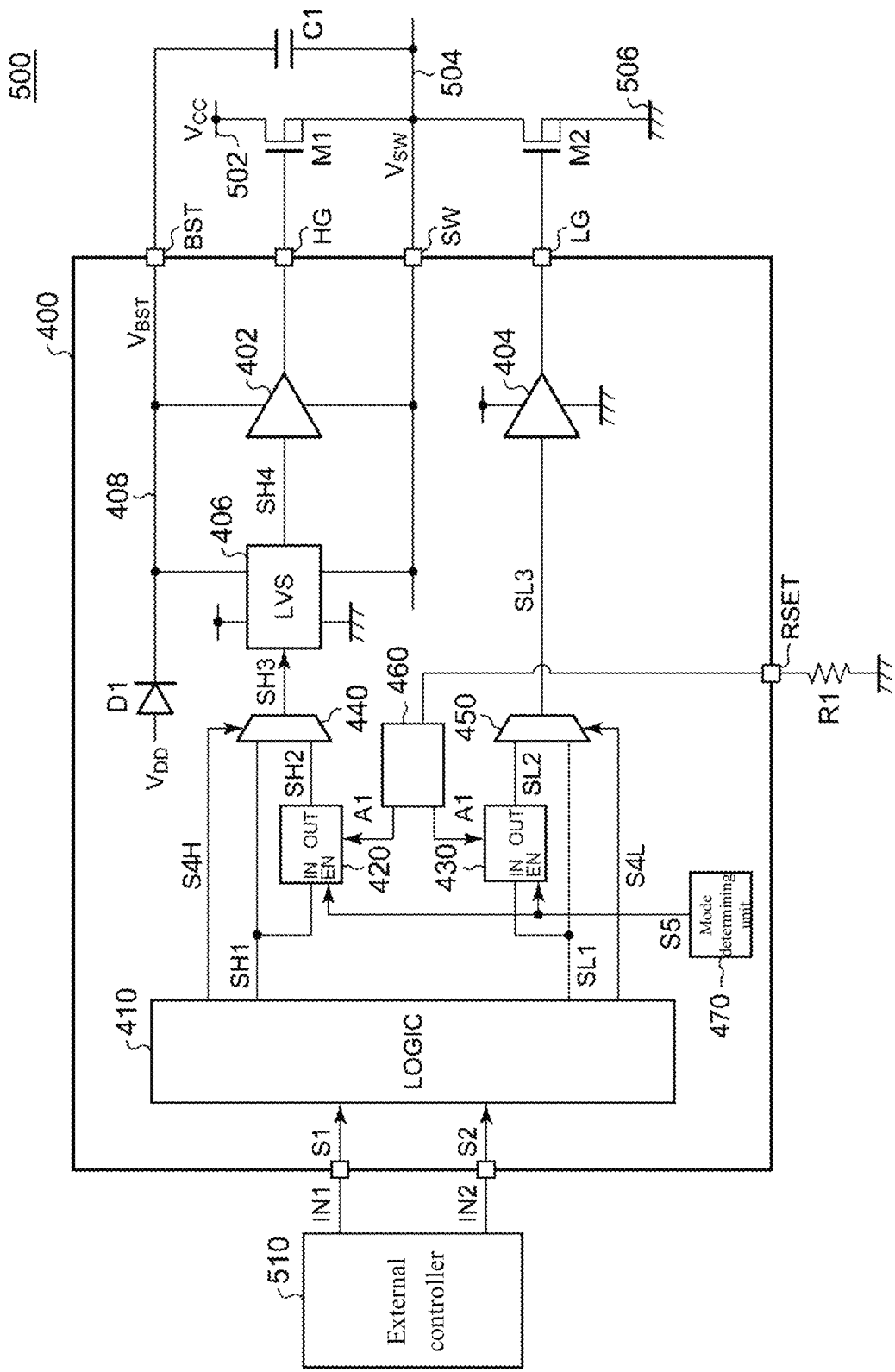
FIG. 1 is a block diagram of a switching circuit including a gate driver circuit according to an embodiment.

A summary of several exemplary embodiments of the present disclosure is described below. The summary serves as the preamble of the detailed description provided below and aims to provide fundamental understanding of the embodiments by describing several concepts of one or more embodiments in brief. It should be noted that the summary is not to be construed as limitations to the scope of the application or disclosure. The summary is not a comprehensive summary of all conceivable embodiments, nor does it intend to specify important elements of all embodiments or to define the scope of a part of or all aspects. For the sake of better description, "one embodiment" sometimes serves as one embodiment of one embodiment (an implementation example or a variation example) or multiple embodiments (implementation examples or variation examples) described in the disclosure.

A gate driver circuit according to an embodiment includes: a logic circuit, configured to specify states of a high-side transistor and a low-side transistor of a drive target, each of the high-side transistor and the low-side transistor receiving a first control input in binary and a second control input in binary, and generate, according to a combination of signal levels of the first control input and the second control input, a first high-side control signal that defines whether the high-side transistor is turned on or off, and a first low-side control signal that defines whether the low-side transistor is turned on or off; a setting pin, connectable to an external resistor; a high-side dead time circuit, configured to receive the first high-side control signal and generate a second high-side control signal; a low-side dead time circuit, configured to receive the first low-side control signal and generate a second low-side control signal; a high-side selector, configured to receive the first high-side control signal and the second high-side control signal, select the first high-side control signal when the high-side transistor is turned off, and select the second high-side control signal when the high-side transistor is turned on; and a low-side selector, configured to receive the first low-side control signal and the second low-side control signal, select the first low-side control signal when the low-side transistor is turned off, and select the second low-side control signal when the low-side transistor is turned on. The high-side dead time circuit includes: a high-side analog delay circuit, configured to delay the first high-side control signal by a delay time corresponding to a resistance value of the external resistor to generate a delayed high-side control signal; and a high-side selector, configured to receive the first high-side control signal and the delayed high-side control signal, select one corresponding to an electrical state of the setting pin, and output the selected one as the second high-side control signal. The low-side dead time circuit includes: a low-side analog delay circuit, configured to delay the first low-side control signal by a delay time corresponding to the resistance value of the external resistor to generate a delayed low-side control signal; and a low-side selector, configured to receive the first low-side control signal and the delayed low-side control signal, select one corresponding to the electrical state of the setting pin, and output the selected one as the second low-side control signal.

According to the configuration above, by appropriately externally setting the state of the setting pin, the high-side analog delay circuit and the low-side analog delay circuit are completely bypassed, so that the dead time in the gate driver circuit can be kept approximate zero.

In one embodiment, the gate driver circuit can further include an analog adjustment circuit configured to generate a charging current according to the resistance value of the external resistor. Each of the high-side analog delay circuit and the low-side analog delay circuit can include a capacitor charged by a charging current.

In one embodiment, the gate driver circuit can further include a comparator configured to compare a voltage of the setting pin with a threshold voltage. The high-side selector and the low-side selector can also be controlled according to an output of the comparator.

In one embodiment, the current source can include: an internal resistor, including a first end connected to the setting pin; a transistor, including a first electrode connected to a second end of the internal resistor; and an operational amplifier, including a first input configured to receive a reference voltage, a second input configured to receive a voltage of the setting pin, and an output connected to a control electrode of the transistor.

In one embodiment, the gate driver circuit can be configured to drive a motor.

In one embodiment, the gate driver circuit can be integrated on a semiconductor substrate. The so-called "monolithically integrated" includes a situation in which all constituting elements of a circuit are formed on a semiconductor substrate, or a situation in which main constituting elements of a circuit are integrated. In order to adjust circuit constants, a part of resistors or capacitors may be arranged outside the semiconductor substrate. By integrating circuits on one chip, the circuit area can be reduced and characteristics of circuit elements can be kept uniform.

EMBODIMENTS

Details of appropriate embodiments are described with reference to the accompanying drawings below. The same or equivalent constituent elements, parts and processes in the accompanying drawings are represented by the same denotations, and repeated description is omitted as appropriate. Moreover, the embodiments are not restrictive of the present disclosure and the application but are illustrative. All features and combinations thereof described in the embodiments are not necessarily intrinsic features or combinations of the present disclosure and application.

In the description of the application, an expression "a state of component A connected to component B" includes a situation where component A and component B are directly connected, or a situation where component A is indirectly connected to component B via another component, provided that the indirect connection does not result in substantial influences on their electrical connection or does not impair functions or effects exerted by their connection.

Similarly, an expression "a state of component C arranged between component A and component B" also includes, in addition to a situation where component A and component C, or component B and component C are directly connected, an indirect connection via another component, provided that the indirect connection does not result in substantial influences on their electrical connection or does not impair functions or effects exerted by their connection.

Moreover, the vertical axis and horizontal axis in the waveform diagrams or timing diagrams referred to in the present application are appropriately scaled up or scaled down for better understanding, and the waveforms in the diagrams are also simplified for better understanding.

FIG. 1 shows a block diagram of a switching circuit 500 including a gate driver circuit 400 according to an embodiment. The switching circuit 500 includes a high-side transistor M1, a low-side transistor M2, the gate driver circuit 400, an external controller 510 and a capacitor C1.

The high-side transistor M1 is connected between an input line 502 and an output line 504, and the low-side transistor M2 is connected between the output line 504 and a ground line 506.

The gate driver circuit 400 controls states of the high-side transistor M1 and the low-side transistor M2 according to control inputs S1 and S2 from the external controller 510. Each of the first control input S1 and the second control input S2 is a binary digital signal, and the states below can be obtained according to a combination of high/low states of the first control input S1 and the second control input S2 for the high-side transistor M1 and the low-side transistor M2.

High output state ϕH: M1 as ON, M2 as OFF
Low output state ϕL: M1 as OFF, M2 as ON
High impedance state ϕHz: M1 as OFF, M2 as OFF Correspondence between the first control input S1 and the second control input S2 with respect to the high output state OH, the low output state ØL and the high impedance state ϕHz is not specifically defined and can be determined as desired.

The gate driver circuit 400 is an integrated circuit (IC) including a high-side driver 402, a low-side driver 404, a level shifter 406, a logic circuit 410, a high-side dead time circuit 420, a low-side dead time circuit 430, a high-side selector 440 and a low-side selector 450 and integrated on a semiconductor substrate.

The gate driver circuit 400 includes input pins IN1 and IN2, a switching pin SW, a bootstrap pin BST, a high-side gate pin HG, a low-side gate pin LG and a setting pin RSET.

The first control input S1 is input to the first input pin IN1, and the second control input S2 is input to the second input pin IN2.

A bootstrap capacitor C1 is connected between the bootstrap pin BST and the switching pin SW. A cathode of a rectifier element D1 is connected to the bootstrap pin BST, and an anode thereof receives a power supply voltage $V_{DD}$. The rectifier element D1 and the capacitor C1 form a bootstrap circuit, and a bootstrap voltage $V_{BST}$ higher than a voltage $V_{SW}$ of the switching pin SW by $V_{DD}$-VF is generated at a bootstrap line 408 connected to the bootstrap pin BST. Vf is a forward voltage of the rectifier element D1. The rectifier element D1 can also be a switch.

The switching pin SW is connected to the output line 504. The high-side gate pin HG is connected to a gate of the high-side transistor M1, and the low-side gate pin LG is connected to a gate of the low-side transistor M2. The setting pin RSET is connected to an external resistor R1.

The logic circuit 410 receives the first control input S1 and the second control input S2, and generates, according to a combination of signal levels of the first control input S1 and the second control input S2, a first high-side control signal SH1 indicating whether the high-side transistor M1 is turned on or off, and a first low-side control signal SL1 indicating whether the low-side transistor M2 is turned on or off.

In one embodiment, the control inputs S1 and S2 and the control signals SH1 and SL1 can also be established to have the correspondence below.

S1=0, S2=0; SH1=L, SH2=L(ϕHz)
S1=0, S2=1; SH1=L, SL1=H (ϕL)
S1=1, S2=0; SH1=H, SL1=L(ϕH)
S1=1, S2=1; SH1=L, SH2=L(ϕHz)

In other embodiments, the control inputs S1 and S2 and the control signals SH1 and SL1 can also be established to have the correspondence below.

S1=0, S2=0; SH1=L, SH2=L(ϕHz)
S1=1, S2=0; SH1=L, SL1=L(ϕHz)
S1=0, S2=1; SH1=L, SL1=H (ϕL)
S1=1, S2=1; SH1=H, SH2=L(ϕH)

The high-side dead time circuit 420 receives the first high-side control signal SH1 and generates a second high-side control signal SH2. The second high-side control signal SH2 is a delayed signal of the first high-side control signal SH1. The high-side dead time circuit 420 receives the first low-side control signal SL1 and generates a second low-side control signal SL2. The second low-side control signal SL2 is a delayed signal of the first low-side control signal SL1.

A delay time τd of the high-side dead time circuit 420 and the low-side dead time circuit 430 can be set according to a resistance value of the external resistor R1. An analog adjustment circuit 460 generates an analog signal A1 according to the resistance value of the external resistor R1. The delay time τd of the high-side dead time circuit 420 and the low-side dead time circuit 430 can be determined according to the analog signal A1. For example, the analog signal A1 can also be a current signal having a current value corresponding to the resistance value of the external resistor R1.

The high-side selector 440 receives the first high-side control signal SH1 and the second high-side control signal SH2, and outputs a third high-side control signal SH3. According to an edge selection signal S4H from the logic circuit 410, the high-side selector 440 selects the first high-side control signal SH1 when the high-side transistor M1 is turned off and selects the second high-side control signal SH2 when the high-side transistor M1 is turned on. That is to say, a positive edge of the third high-side control signal SH3 is consistent with that of the second high-side control signal SH2, and a negative edge of the third high-side control signal SH3 is consistent with that of the first high-side control signal SH1.

The low-side selector 450 receives the first low-side control signal SL1 and the second low-side control signal SL2, and outputs a third low-side control signal SL3. According to an edge control signal S4L from the logic circuit 410, the low-side selector 450 selects the first low-side control signal SL1 when the low-side transistor M2 is turned off and selects the second low-side control signal SL2 when the low-side transistor M2 is turned on. That is to say, a positive edge of the third low-side control signal SL3 is consistent with that of the second low-side control signal SL2, and a negative edge of the third low-side control signal SL3 is consistent with that of the first low-side control signal SL1.

The level shifter 406 shifts up the level of the signal SH3 output from the high-side selector 440. The high-side driver 402 drives the high-side transistor M1 based on the level shifted signal SH4.

The low-side driver 404 drives the low-side transistor M2 based on the signal SL3 output from the low-side selector 450.

The gate driver circuit 400 can be used, as selected by a user (a designer of the switching circuit 500), in a first mode in which a dead time (an internal dead time) determined according to the resistance value of the external resistor R1 is used, and in a second mode in which the internal dead time is not used. A mode determining unit 470 determines the first mode and the second mode. The mode determining unit 470 supplies a determination signal S5 indicating the mode to the high-side dead time circuit 420 and the low-side dead time circuit 430.

The high-side dead time circuit 420 and the low-side dead time circuit 430 are in an enabled state when the determination signal S5 indicates the first mode and are in a disabled state when the determination signal S5 indicates the second mode. In the enabled state, the high-side dead time circuit 420 (430) provides the input signal SH1 (SL1) with a delay according to the analog signal A1. In the disabled state, the high-side dead time circuit 420 (430) directly outputs the input signal SH1 (SL1) without delaying the input signal SH1 (SL1).

Figure 2:
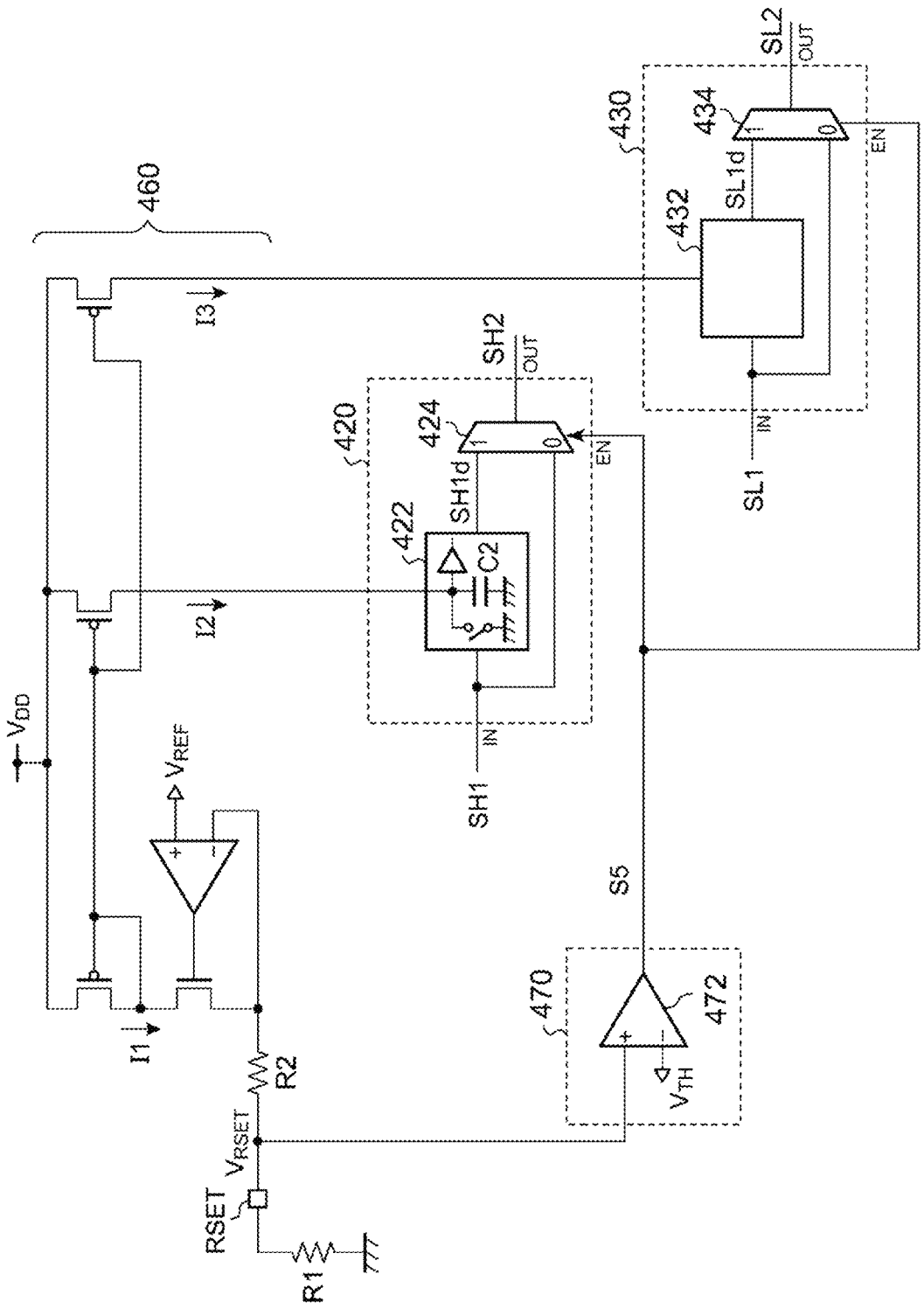
FIG. 2 is a circuit diagram of a specific configuration example of a part of a gate driver circuit.

FIG. 2 shows a circuit diagram of a specific configuration example of a part of the gate driver circuit 400. FIG. 2 depicts a configuration including the analog adjustment circuit 460, the high-side dead time circuit 420, the low-side dead time circuit 430 and the mode determining unit 470.

The analog adjustment circuit 460 includes a resistor R2, a transistor M3, an operational amplifier 462 and a current mirror circuit 464. The resistor R2, the transistor M3 and the operational amplifier 462 together with the external resistor R1 form a constant current source.

A first end of the resistor R2 is connected to the setting pin RSET. A first electrode (a source) of the transistor M3 is connected to a second end of the resistor R2. A reference voltage $V_{REF}$ is applied to a first input (a non-inverting input terminal) of the operational amplifier 462. A second input (an inverting input terminal) of the operational amplifier 462 is connected to a source of the transistor M3. A current I1 having a current value I1=$V_{REF}$/(R1+R2) flows through the transistor M3. The current mirror circuit 464 returns the current I1, and supplies charging currents I2 and I3 which are the analog signal A1 to the high-side dead time circuit 420 and the low-side dead time circuit 430.

The high-side dead time circuit 420 includes an analog delay circuit 422 and a selector 424.

The analog delay circuit 422 is implemented by a capacitor. For example, the analog delay circuit 422 includes a capacitor C2, and is triggered by the transition of the first high-side control signal SH1 to charge the capacitor C2 by the charging current I2. Moreover, if a voltage change of a predetermined width ΔV is generated in the capacitor C2, a change occurs in a delayed high-side control signal SH1d. The analog delay circuit 422 can be implemented by well-known techniques. The delay time τd of the analog delay circuit 422 is inversely proportional to the charging current I1 and is thus directly proportional to (R1+R2). That is to say, the delay time τd increases as the resistance value of the external resistor R1 gets larger and decreases as the resistance value of the external resistor R1 gets smaller.

The selector 424 receives the delayed high-side control signal SH1d and the first high-side control signal SH1. The selector 424 selects one corresponding to an electrical state of the setting pin RSET and outputs the selected one as the second high-side control signal SH2.

In this embodiment, the mode determining unit 470 determines the mode based on the electrical state of the setting pin RSET. The mode determining unit 470 includes a comparator 472. The comparator 472 compares a voltage $V_{RSET}$ of the setting pin RSET with a predetermined threshold voltage $V_{TH}$, and generates, according to a comparison result, the determination signal S5 indicating whether the internal dead time is valid or invalid.

The voltage of the setting pin RSET is represented by an equation below.

$$V_{RSET} = V_{REF} \times R1/(R1+R2)$$

That is to say, the voltage $V_{RSET}$ increases as the resistance value of the external resistor R1 gets larger, or alternatively speaking, the voltage $V_{RSET}$ increases as the delay time τd increases, and the voltage $V_{RSET}$ decreases as the resistance value of the external resistor R1 gets smaller, or alternatively speaking, the voltage $V_{RSET}$ decreases as the delay time τd decreases.

For example, when $V_{RSET}$>$V_{TH}$, the determination signal S5 uses a first level (high) indicating that the internal dead time is valid, and when $V_{RSET}<V_{TH}$, the determination signal S5 uses a second level (low) indicating that the internal dead time is invalid.

The selector 424 selects the delayed high-side control signal SH1*d* delayed by the analog delay circuit 422 when the determination signal S5 is at a first level and selects the high-side control signal SH1 before the delay when the determination signal S5 is at a second level.

The low-side dead time circuit 430 includes an analog delay circuit 432 and a selector 434 and is configured and operates in a manner similar to the high-side dead time circuit 420.

The configuration of the gate driver circuit 400 is as described above. The operation of the gate driver circuit 400 is described below.

Figure 3:
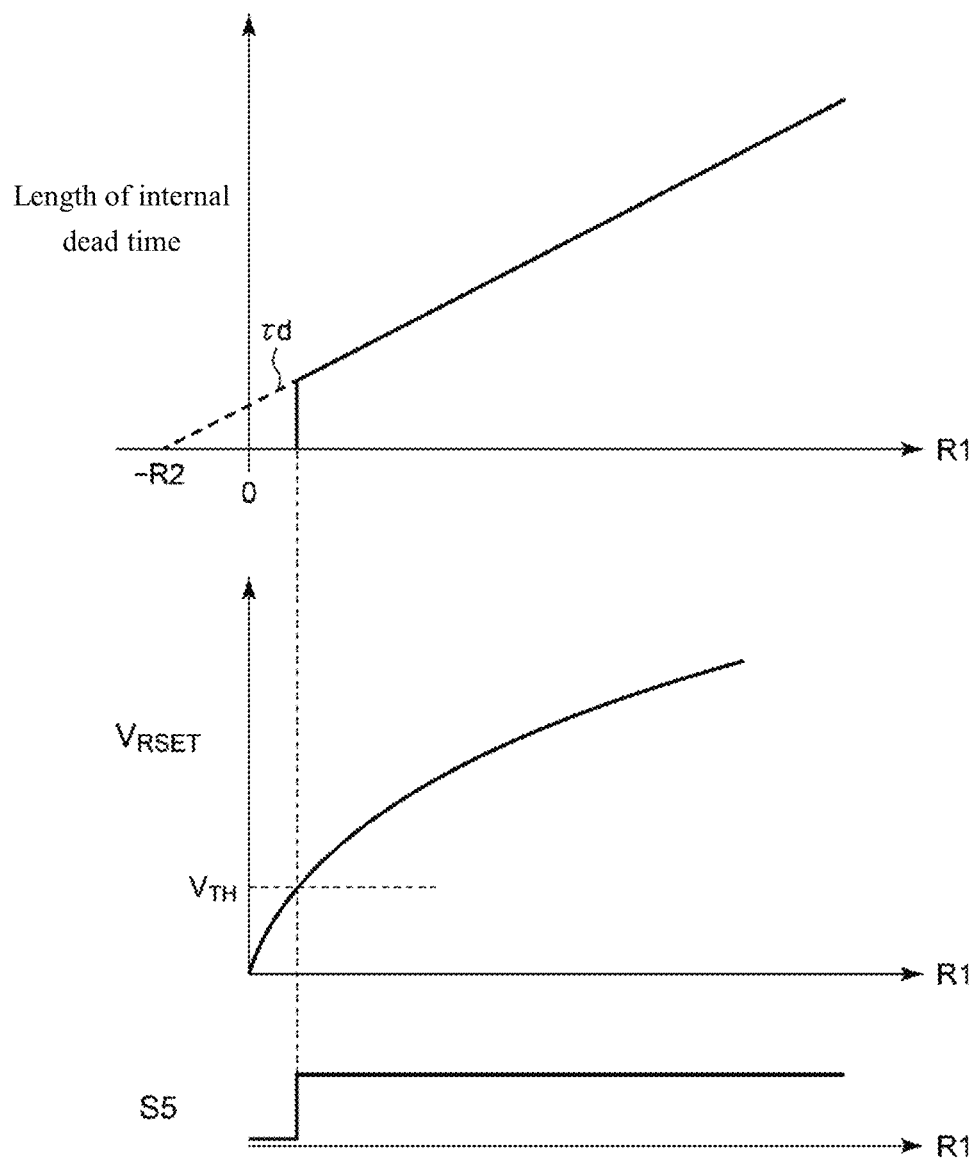
FIG. 3 is a diagram of an operation of a gate driver circuit.

FIG. 3 shows a diagram of an operation of the gate driver circuit 400. In FIG. 3, a length of the internal dead time, the voltage of the setting pin RSET and the determination signal S5 are sequentially depicted from top to bottom. The horizontal axis is the resistance value of the external resistor R1.

The delay time τd of the high-side dead time circuit 420 is directly proportional to R1+R2. The voltage $V_{RSET}$ of the setting pin RSET decreases as the resistance value of the external resistor R1 gets smaller. Within a range in which the voltage $V_{RSET}$ of the setting pin RSET higher than the threshold voltage $V_{TH}$, the determination signal S5 becomes at a first level, and the delay time τd of the analog delay circuit 422 becomes the length of the internal dead time.

When the resistance value of the external resistor R1 while $V_{RSET}=V_{TH}$ is set to R0, within a range in which R1>R0, the length of the internal dead time changes linearly relative to R1.

Within a range in which R1<R0, the determination signal S5 becomes at a second level, and the analog delay circuit 422 is bypassed. As a result, the length of the internal dead time is irrelevant to the delay time τd and is zero.

The gate driver circuit 400 can be used, as selected by a user (a designer of the switching circuit 500), in a first mode in which the internal dead time is used, and in a second mode in which the internal dead time is not used.

(First Mode)

In the first mode, the gate driver circuit 400 is entrusted to control the dead time. A user connects the external resistor R1 having a resistance value corresponding to a desired internal dead time to the setting pin RSET. The resistance value of the external resistor R1 at this point in time is greater than R0.

Figure 4:
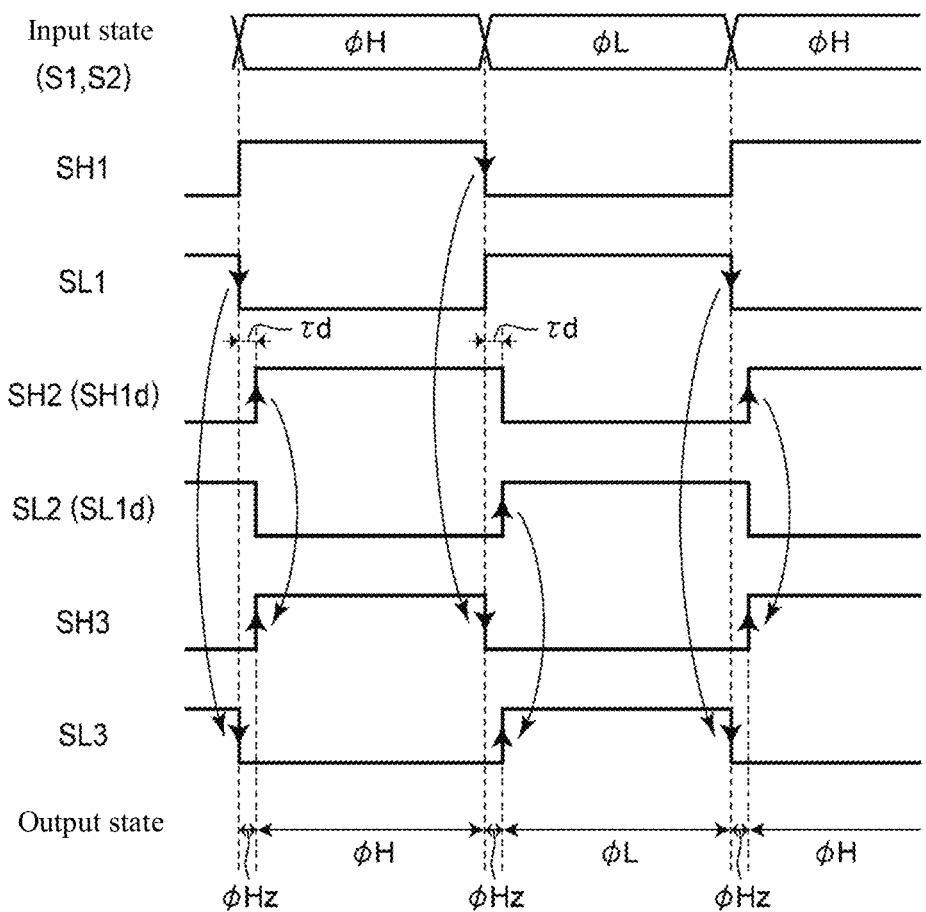
FIG. 4 is a timing diagram of a first mode.

FIG. 4 shows a timing diagram of the first mode. In the first mode, a high output state ϕH and a low output state ϕL are alternately repeated according to a state (an input state) determined by a combination of the first control input S1 and the second control input S2.

In the first mode, the delayed high-side control signal SH1*d* is used as the second high-side control signal SH2, and the delayed low-side control signal SL1*d* is used as the second low-side control signal SL2. A state (an output state) determined by a combination of the third high-side control signal SH3 and the third low-side control signal SL3 includes the high impedance state ϕHz, and a length of the high impedance state ϕHz is the delay time τd.

(Second Mode)

In the second mode, the external controller 510 controls the dead time, and invalidates the internal dead time of the gate driver circuit 400. A user connects the external resistor R1 having a resistance value smaller than R0 to the setting pin RSET.

Figure 5:
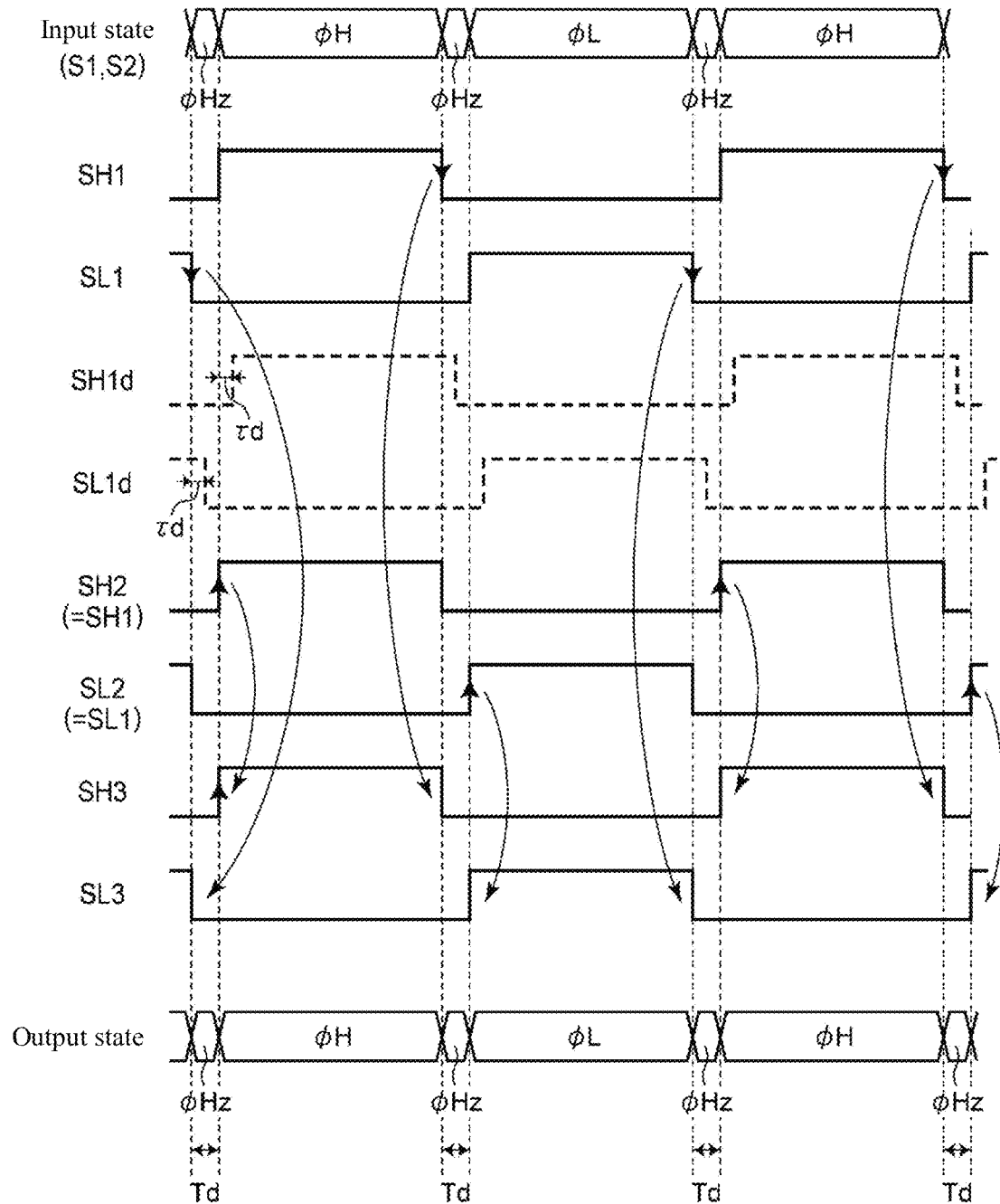
FIG. 5 is a timing diagram of a second mode.

FIG. 5 shows a timing diagram of the second mode. In the second mode, a high output state H, a high impedance state ϕHz, a low output state ØL and a high impedance state ϕHz are sequentially repeated according to a state (an input state) determined by a combination of the first control input S1 and the second control input S2. The high impedance state ϕHz is equivalent to a dead time.

In the second mode, the first high-side control signal SH1 is used as the second high-side control signal SH2, and the first low-side control signal SL1 is used as the second low-side control signal SL2. The delayed high-side control signal SH1*d* and the delayed low-side control signal SL1*d* are not used.

A state (an output state) determined by a combination of the third high-side control signal SH3 and the third low-side control signal SL3 includes the high impedance state ϕHz, and a length Td of the high impedance state ϕHz is determined by only the control inputs S1 and S2, and is irrelevant to the resistance value of the external resistor R1, that is, the delay time τd of the analog delay circuit 422. That is to say, in the gate driver circuit 400, the internal dead time can infinitely approximate zero by selecting the second mode.

The advantages of the gate driver circuit 400 will become more readily apparent in comparison with a comparison technique. In the comparison technique, the selector 424 in FIG. 2 is omitted, and SH2=SH1*d* constantly holds true. In the comparison technique, in order to control the dead time in the external controller 510, the resistance value of the external resistor R1 is infinitely small, and the delay time τd of the analog delay circuit 422 is reduced. However, since the delay time τd cannot be completely set to zero, the efficiency degrades as a result of the dead time set in the external controller 510 added to the internal dead time.

In the gate driver circuit 400 of the embodiment, when the dead time is controlled in the external controller 510, the internal dead time infinitely approximates zero since the analog delay circuit 422 is bypassed, and thus the efficiency is improved.

Next, the use of the gate driver circuit 400 is described.

Figure 6:
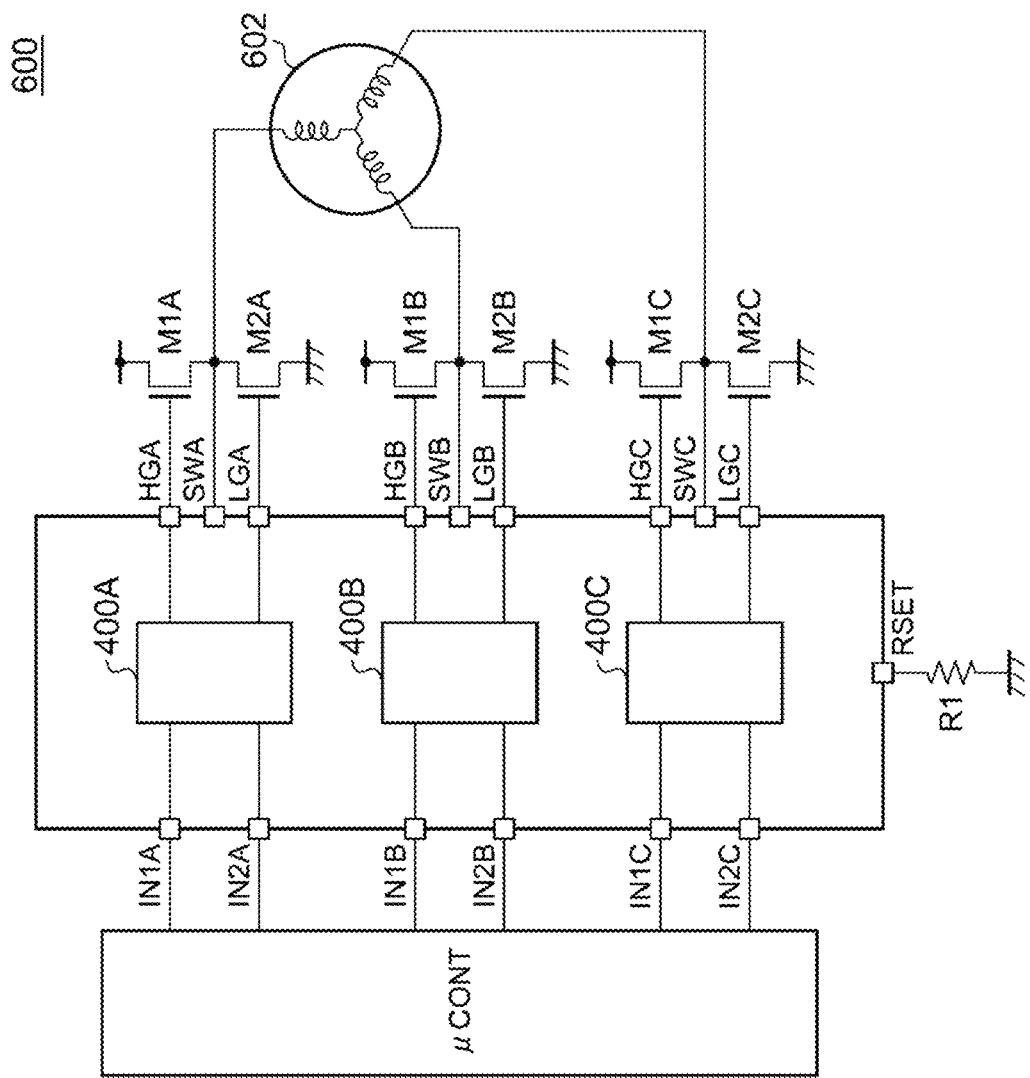
FIG. 6 is a circuit diagram of a motor control system including a gate driver circuit.

FIG. 6 shows a circuit diagram of a motor control system 600 including the gate driver circuit 400. The motor control system 600 includes a motor 602, a microcontroller 610 and a three-phase gate driver circuit 620. In this embodiment, the motor 602 is a three-phase motor, and the three-phase gate driver circuit 620 includes gate driver circuits 400A, 400B and 400C of three phasors. The microcontroller 610 generates control signals of three phases to have a state (for example, the number of rotations or a position of a rotatable element) of the motor 602 approximate a target state and supplies the control signals to the three-phase gate driver circuit 620. The setting pin RSET is shared by the three phases.

Moreover, the use of the gate driver circuit 400 is not limited to a motor driver and can be used in various application programs having a switching circuit.

(Notes)

The present application discloses the following techniques.

(Item 1)

A gate driver circuit, comprising:
  a logic circuit, configured to
    specify states of a high-side transistor and a low-side transistor of a drive target, each of the high-side transistor and the low-side transistor receiving a first control input in binary and a second control input in binary, and generate, according to a combination of signal levels of the first control input and the second control input, a first high-side control signal that defines whether the high-side transistor is turned on or off, and a first low-side control signal that defines whether the low-side transistor is turned on or off;

a setting pin, connectable to an external resistor;

a high-side dead time circuit, configured to receive the first high-side control signal and generate a second high-side control signal;

a low-side dead time circuit, configured to receive the first low-side control signal and generate a second low-side control signal;

a high-side selector, configured to receive the first high-side control signal and the second high-side control signal, select the first high-side control signal when the high-side transistor is turned off, and select the second high-side control signal when the high-side transistor is turned on; and a low-side selector, configured to receive the first low-side control signal and the second low-side control signal, select the first low-side control signal when the low-side transistor is turned off, and select the second low-side control signal when the low-side transistor is turned on, wherein the high-side dead time circuit includes:
a high-side analog delay circuit, configured to delay the first high-side control signal by a delay time corresponding to a resistance value of the external resistor to generate a delayed high-side control signal; and
a high-side selector, configured to receive the first high-side control signal and the delayed high-side control signal, select one corresponding to an electrical state of the setting pin, and output the selected one as the second high-side control signal, the low-side dead time circuit includes:
a low-side analog delay circuit, configured to delay the first low-side control signal by a delay time corresponding to the resistance value of the external resistor to generate a delayed low-side control signal; and
a low-side selector, configured to receive the first low-side control signal and the delayed low-side control signal, select one corresponding to the electrical state of the setting pin, and output the selected one as the second low-side control signal.

(Item 2)

The gate driver circuit according to Item 1, further comprising:

an analog adjustment circuit, configured to generate charging current according to the resistance value of the external resistor, wherein
each of the high-side analog delay circuit and the low-side analog delay circuit includes a capacitor charged by charging current.

(Item 3)

The gate driver circuit according to Item 2, further comprising:

a comparator, configured to compare a voltage of the setting pin with a threshold voltage, wherein
the high-side selector and the low-side selector are controlled according to an output of the comparator.

(Item 4)

The gate driver circuit according to Item 2 or 3, wherein the analog adjustment circuit includes:

an internal resistor, including a first end connected to the setting pin;

a transistor, including a first electrode connected to a second end of the internal resistor; and an operational amplifier, including a first input configured to receive a reference voltage, a second input configured to receive a voltage of the setting pin, and an output connected to a control electrode of the transistor.

(Item 5)

The gate driver circuit according to any one of Items 1 to 4, wherein the gate driver circuit is configured to drive a motor.

(Item 6)

The gate driver circuit according to any one of Items 1 to 5, wherein the gate driver circuit is integrated on a semiconductor substrate.

The invention claimed is:

1. A gate driver circuit, comprising:

a logic circuit, configured to
specify states of a high-side transistor and a low-side transistor of a drive target, each of the high-side transistor and the low-side transistor receiving a first control input in binary and a second control input in binary, and
generate, according to a combination of signal levels of the first control input and the second control input,
a first high-side control signal that defines whether the high-side transistor is turned on or off, and
a first low-side control signal that defines whether the low-side transistor is turned on or off;

a setting pin, connectable to an external resistor;

a high-side dead time circuit, configured to receive the first high-side control signal and generate a second high-side control signal;

a low-side dead time circuit, configured to receive the first low-side control signal and generate a second low-side control signal;

a high-side selector, configured to
receive the first high-side control signal and the second high-side control signal,
select the first high-side control signal when the high-side transistor is turned off, and
select the second high-side control signal when the high-side transistor is turned on; and a low-side selector, configured to
receive the first low-side control signal and the second low-side control signal,
select the first low-side control signal when the low-side transistor is turned off, and
select the second low-side control signal when the low-side transistor is turned on, wherein the high-side dead time circuit includes:
a high-side analog delay circuit, configured to delay the first high-side control signal by a delay time corresponding to a resistance value of the external resistor to generate a delayed high-side control signal; and
a high-side selector, configured to
receive the first high-side control signal and the delayed high-side control signal,
select one corresponding to an electrical state of the setting pin, and
output the selected one as the second high-side control signal, the low-side dead time circuit includes:
a low-side analog delay circuit, configured to delay the first low-side control signal by a delay time corresponding to the resistance value of the external resistor to generate a delayed low-side control signal; and a low-side selector, configured to
receive the first low-side control signal and the delayed low-side control signal,
select one corresponding to the electrical state of the setting pin, and
output the selected one as the second low-side control signal.

2. The gate driver circuit of claim 1, further comprising:
an analog adjustment circuit, configured to generate charging current according to the resistance value of the external resistor, wherein
each of the high-side analog delay circuit and the low-side analog delay circuit includes a capacitor charged by charging current.

3. The gate driver circuit of claim 2, further comprising:
a comparator, configured to compare a voltage of the setting pin with a threshold voltage, wherein
the high-side selector and the low-side selector are controlled according to an output of the comparator.

4. The gate driver circuit of claim 2, wherein the analog adjustment circuit includes:
an internal resistor, including a first end connected to the setting pin;
a transistor, including a first electrode connected to a second end of the internal resistor;
an operational amplifier, including:
a first input, configured to receive a reference voltage;
a second input, configured to receive a voltage of the setting pin; and
an output, connected to a control electrode of the transistor.

5. The gate driver circuit of claim 3, wherein the analog adjustment circuit includes:
an internal resistor, including a first end connected to the setting pin;
a transistor, including a first electrode connected to a second end of the internal resistor;
an operational amplifier, including:
a first input, configured to receive a reference voltage;
a second input, configured to receive the voltage of the setting pin; and
an output, connected to a control electrode of the transistor.

6. The gate driver circuit of claim 1, wherein the gate driver circuit is configured to drive a motor.

7. The gate driver circuit of claim 2, wherein the gate driver circuit is configured to drive a motor.

8. The gate driver circuit of claim 3, wherein the gate driver circuit is configured to drive a motor.

9. The gate driver circuit of claim 1, wherein the gate driver circuit is integrated on a semiconductor substrate.

10. The gate driver circuit of claim 2, wherein the gate driver circuit is integrated on a semiconductor substrate.

11. The gate driver circuit of claim 3, wherein the gate driver circuit is integrated on a semiconductor substrate.

* * * * *